United States Patent
Wu et al.

(10) Patent No.: US 6,999,319 B2
(45) Date of Patent: Feb. 14, 2006

(54) SUPPORT FRAME STRUCTURE

(75) Inventors: Chia-Kang Wu, Taipei (TW);
Zheng-Jin Zhao, Taipei (TW);
Fu-Jung Hsui, Taipei (TW)

(73) Assignee: Tatung Co., Ltd., Taipei (TW)

( * ) Notice: Subject to any disclaimer, the term of this patent is extended or adjusted under 35 U.S.C. 154(b) by 0 days.

(21) Appl. No.: 10/923,779

(22) Filed: Aug. 24, 2004

(65) Prior Publication Data

US 2005/0219833 A1    Oct. 6, 2005

(30) Foreign Application Priority Data

Apr. 6, 2004    (TW) .............................. 93205211 U

(51) Int. Cl.
*H05K 7/14* (2006.01)

(52) U.S. Cl. .................... 361/724; 174/52.1; 174/52.3; 361/725; 361/726; 361/803

(58) Field of Classification Search ........ 361/724–726, 361/727, 741, 742, 756, 758, 608, 644, 645, 361/655, 809; 174/52.1, 52.3
See application file for complete search history.

(56) References Cited

U.S. PATENT DOCUMENTS

| 4,327,835 | A | * | 5/1982 | Leger ...................... 211/41.17 |
| 4,896,248 | A | * | 1/1990 | Zell et al. .................... 361/802 |
| 5,666,271 | A | * | 9/1997 | Kim et al. .................. 361/726 |
| 5,808,867 | A | * | 9/1998 | Wang .......................... 361/695 |
| 5,912,799 | A | * | 6/1999 | Grouell et al. .............. 361/685 |
| 6,198,633 | B1 | * | 3/2001 | Lehman et al. ............. 361/756 |
| 6,563,714 | B2 | * | 5/2003 | Chang ......................... 361/752 |
| 6,580,616 | B2 | * | 6/2003 | Greenside et al. .......... 361/752 |
| 2005/0135060 | A1 | * | 6/2005 | Cote et al. .................. 361/695 |

* cited by examiner

*Primary Examiner*—Kamand Cuneo
*Assistant Examiner*—Hung Nguyen
(74) *Attorney, Agent, or Firm*—Bacon & Thomas, PLLC

(57) ABSTRACT

A support frame structure mounted inside the housing of a computer system for supporting electronic drives is disclosed to include a plurality of upright partition plates affixed to the bottom panel between two upright side panels of the housing, a cover plate fastened to the upright side panels of the housing and covered on the upright partition plates, and a detachable upright back panel, which has a bottom side engaged into notched locating strips at the back side of each upright partition plate and a top side terminating in a forwardly extended bend, which is covered on a rear part of the top of each upright partition plate and affixed thereto with a screw.

4 Claims, 2 Drawing Sheets

SUPPORT FRAME STRUCTURE

BACKGROUND OF THE INVENTION

1. Field of the Invention

The present invention relates to a support frame structure and more particularly, to such a support frame structure, which is practical for use in a computer system, for example, a server for supporting HDD (hard disk drives).

2. Description of Related Art

In a computer, more particularly, a server, hard disk drives (HDD) are arranged in an array, and a support frame structure is provided inside the housing of the server to support the HDD in the place. The support frame structure comprises a vertical bracket that accommodates a circuit board, which comprises a plurality of connection ports for the connection of the HDD.

According to the aforesaid conventional design, the vertical bracket is formed integral with the support frame structure. After installation of the support frame structure in the housing of the server, the vertical bracket is kept to suspend inside the housing of the server. When inserting a HDD into the server, the rear bracket of the support frame structure may be forced to bias backwards by the forward push force of the HDD, thereby causing the user unable to aim the connector of the HDD at the corresponding connection port of the circuit board on the vertical bracket. On the contrary, when pulling one HDD out of the server to disconnect the connector of the HDD from the corresponding connection port of the circuit board on the vertical bracket, the vertical bracket may be forced to bias forwards or damaged due to the effect of the forward drag force from the HDD.

Further, during a maintenance or repair work, the maintenance engineer must remove all HDD from the server, and then remove or install the support frame structure. Therefore, this design of support frame structure is not satisfactory in function.

SUMMARY OF THE INVENTION

The present invention has been accomplished under the circumstances in view. It is therefore the main object of the present invention to provide a support frame structure, which can quickly and accurately be set into position to save installation time and, which is highly detachable for easy performance of a maintenance or repair work.

To achieve this and other objects of the present invention, the support frame structure is mounted inside the housing of a computer, which comprises a bottom panel, and two side panels perpendicularly upwardly extended from the bottom panel at two opposite longitudinal sides. The support frame structure is comprised of at least one upright partition plate, a cover plate, and an upright back panel. The at least one upright partition plate is perpendicularly mounted on the bottom panel of the housing and extended in longitudinal direction between the two side panels of the housing, each comprising a top flange, a rear edge, at least one front mounting device and at least one rear mounting device provided at the top flange, a locating strip backwardly protruded from a bottom side of the rear edge, and an upward locating notch formed in a top side of the locating strip. The cover plate is mounted on the two side panels of the housing and covered on the top flange of each upright partition plate, comprising at least one mounting device correspondingly fastened to the at least one front mounting device of each upright partition plate. The upright back panel has a bottom side engaged into the upright locating notch in the locating strip of each upright partition plate, a top side forming a forwardly extended top bend and covered over the top flange of each upright partition plate, and at least one mounting device correspondingly fastened to the at least one rear mounting device of each upright partition plate.

As indicated above, the bottom side of the upright back panel is downwardly engaged into the upward locating notch in the locating strip of each upright partition plate for quick positioning during installation. Further, during a maintenance or repair work, the upright back panel can be directly detached from the at least one upright partition plate without removing the cover plate.

DETAILED DESCRIPTION OF THE PREFERRED EMBODIMENT

Figure 1:
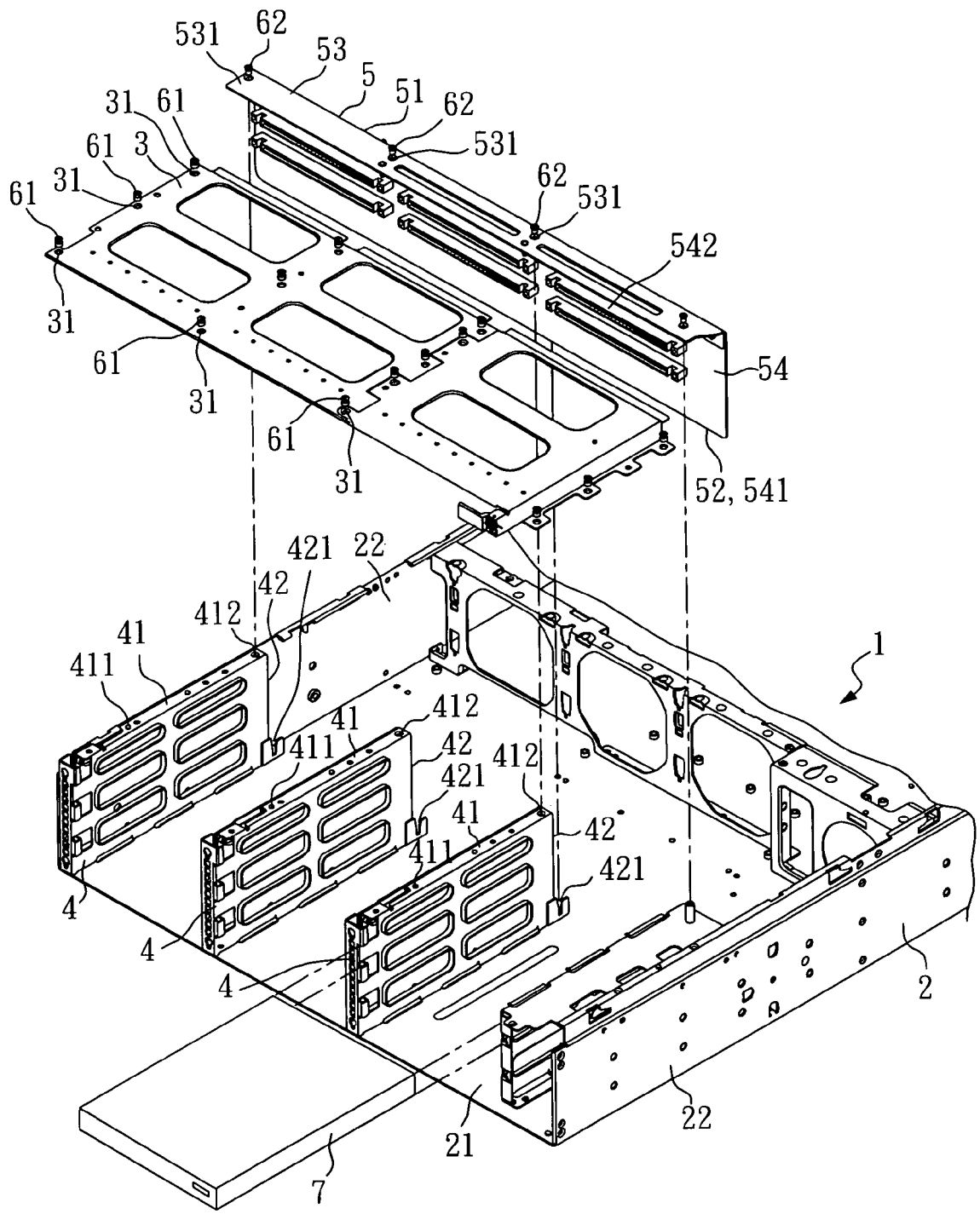
FIG. 1 is an exploded view of the preferred embodiment of the present invention.
Figure 2:
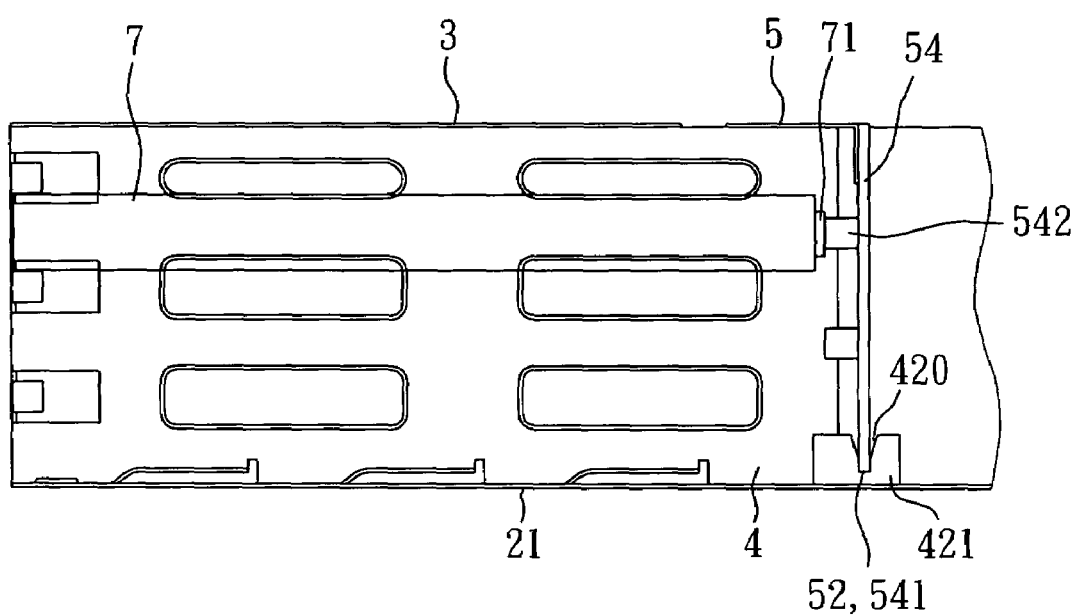
FIG. 2 is a sectional view of the preferred embodiment of the present invention.

Referring to FIGS. 1 and 2, a support frame structure is shown mounted inside the housing 2 of a computer system 1. The housing 2 comprises a bottom panel 21, and two side panels 22 perpendicularly upwardly extended from the bottom panel 21 at two opposite longitudinal sides.

The support frame structure is generally comprised of three upright partition plates 4, a cover plate 3, and an upright back panel 5. The three upright partition plates 4 are respectively perpendicularly mounted on the bottom panel 21 of the housing 2 and extended in longitudinal direction between the two side panels 22. Each upright partition plate 4 comprises a top flange 41, a rear edge 42, a plurality of front mounting devices 411 and a rear mounting device 412 provided at the top flange 41, a locating strip 421 backwardly protruded from the bottom side of the rear edge 42, and an upward locating notch 420 formed in the top side of the locating strip 421. According to the present preferred embodiment, the front mounting devices 411 and the rear mounting device 412 are screw holes.

The cover plate 3 is mounted on the two side panels 22 of the housing 2 at the top and covered on the top flanges 41 of the three upright partition plates 4, comprising a mounting structure 31. According to the present preferred embodiment, the mounting structure 31 is comprised of a plurality of mounting through holes correspondingly aimed at the screw holes of the front mounting devices 411 of the three upright partition plates 4. Screws 61 are respectively mounted in the mounting through holes of the mounting structure 31 and threaded into the correspondingly screw holes of the front mounting devices 411 to affix the cover plate 3 to the upright partition plates 4.

The upright back panel 5 has a top side 51 and a bottom side 52. The top side 51 comprises a forwardly extended top bend 53, and a plurality of mounting devices, for example, mounting through holes 531 provided at the top bend 53. According to the present preferred embodiment, the upright back panel 5 is a circuit board 54. The bottom side 52 is the bottom edge 541 of the circuit board 54. Further, a plurality of connection ports 542 are provided at the circuit board 54.

During installing, the bottom side 52 of the upright back panel 5 is downwardly engaged into the upward locating notch 420 in the locating strip 421 of each upright partition plate 4, keeping the top bend 53 covered over the top flange 41 of each upright partition plate 4 and the mounting through holes 531 respectively aimed at the corresponding rear mounting devices 412 of the upright partition plates 4, and then screws 62 are respectively mounted in the mounting through holes 531 and threaded into the corresponding rear mounting devices (screw holes) 412 of the three upright partition plates 4 to affix the upright back panel 5 to the three upright partition plates 4.

As indicated above, the bottom side 52 of the upright back panel 5 is downwardly engaged into the upward locating notch 420 in the locating strip 421 of each upright partition plate 4 for quick positioning during installing. When inserting a HDD 7 (hard disk drive) into the housing 2 and pushing the HDD 7 to the back against the upright back panel 5, the notched locating strips 421 of the three upright partition plates 4, hold the upright back panel 5 firmly in position against backward pressure from the HDD 7, enabling the connector 71 of the HDD 7 to be accurately inserted into the corresponding connection port 542 at the upright back panel 5. On the contrary, when removing the HDD 7 out of the housing 2, the notched locating strips 421 of the upright partition plates 4 hold the upright back panel 5 firmly in position against forward drag force from the HDD 7.

Further, because the cover plate 3 and the upright back panel 5 are independent members, the upright back panel 5 can be detached from the three upright partition plates 4 during a maintenance or repair work without removing the cover plate 3.

Although the present invention has been explained in relation to its preferred embodiment, it is to be understood that many other possible modifications and variations can be made without departing from the spirit and scope of the invention as hereinafter claimed.

What is claimed is:

1. A support frame structure mounted inside the housing of a computer system, said housing comprising a bottom panel, and two side panels perpendicularly upwardly extended from the bottom panel at two opposite longitudinal sides, said support frame structure comprising:

at least one upright partition plate perpendicularly mounted on the bottom panel of said housing and extended in longitudinal direction between said the two side panels of said housing, each said upright partition plate comprising a top flange, a rear edge, at least one front mounting device and at least one rear mounting device provided at said top flange, a locating strip backwardly protruded from a bottom side of said rear edge, and an upward locating notch formed in a top side of said locating strip;

a cover plate mounted on said the two side panels of said housing and covered on the top flange of each said upright partition plate, said cover plate comprising at least one mounting device correspondingly fastened to the at least one front mounting device of each said upright partition plate; and an upright back panel, said upright back panel having a bottom side engaged into the upright locating notch in the locating strip of each said upright partition plate, a top side forming a forwardly extended top bend and covered over the top flange of each said upright partition plate, and at least one mounting device correspondingly fastened to the at least one rear mounting device of each said upright partition plate.

2. The support frame structure as claimed in claim 1, wherein said upright back panel is a circuit board, said circuit board having a bottom edge forming the bottom side of said upright back panel.

3. The support frame structure as claimed in claim 1, wherein the at least one front mounting device of each said upright partition plate each is comprised of a screw hole; the at least one mounting device of said cover plate each is comprised of a mounting through hole correspondingly fastened to the screw hole of each said upright partition plate with a respective screw.

4. The support frame structure as claimed in claim 1, wherein the at last one rear mounting device of each said upright partition plate each is comprised of a screw hole; the at least one mounting device of said upright back panel each is comprised of a mounting through hole correspondingly fastened to the screw hole of each said upright partition plate with a respective screw.

* * * * *